(12) United States Patent
Hasegawa et al.

(10) Patent No.: US 7,455,789 B2
(45) Date of Patent: Nov. 25, 2008

(54) STAMPER, LITHOGRAPHIC METHOD OF USING THE STAMPER AND METHOD OF FORMING A STRUCTURE BY A LITHOGRAPHIC PATTERN

(75) Inventors: Mitsuru Hasegawa, Hitachi (JP); Akihiro Miyauchi, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 114 days.

(21) Appl. No.: 11/362,146

(22) Filed: Feb. 27, 2006

(65) Prior Publication Data

US 2006/0138080 A1 Jun. 29, 2006

Related U.S. Application Data

(62) Division of application No. 10/628,275, filed on Jul. 29, 2003, now Pat. No. 7,192,529.

(30) Foreign Application Priority Data

Aug. 1, 2002 (JP) ............................. 2002-224327

(51) Int. Cl.
*B44C 1/22* (2006.01)
*C03C 15/00* (2006.01)
*C03C 25/68* (2006.01)
*C23F 1/00* (2006.01)

(52) U.S. Cl. ........................................ 216/44; 430/313

(58) Field of Classification Search .................. 216/41, 216/44; 264/1.33; 360/135; 428/64.1–64.4; 430/321, 313

See application file for complete search history.

(56) References Cited

U.S. PATENT DOCUMENTS

| 5,789,117 | A | 8/1998 | Chen |
| 5,817,242 | A | 10/1998 | Biebuyck et al. |
| 5,900,160 | A * | 5/1999 | Whitesides et al. ........... 216/41 |
| 6,027,595 | A * | 2/2000 | Suleski ....................... 156/230 |
| 6,127,263 | A | 10/2000 | Parikh |
| 6,190,809 | B1 | 2/2001 | Tzu et al. |
| 6,306,547 | B1 | 10/2001 | Kobayashi |
| 6,350,360 | B1 | 2/2002 | Bonivert et al. |
| 2002/0050220 | A1 | 5/2002 | Schueller et al. |
| 2004/0224261 | A1* | 11/2004 | Resnick et al. .............. 430/311 |

FOREIGN PATENT DOCUMENTS

DE 102 17 089 10/2003

(Continued)

OTHER PUBLICATIONS

Communication and Partial European Search Report issued Oct. 15, 2004, for No. EP 03 01 6539.

(Continued)

*Primary Examiner*—Roberts Culbert
(74) *Attorney, Agent, or Firm*—Antonelli, Terry, Stout & Kraus, LLP.

(57) ABSTRACT

A stamper includes a substrate and a plurality of protrusions of different heights formed on one of the surfaces of the substrate, the protrusions of larger height having a stack structure formed of at least two layers of at least two types of materials, thereby transferring a plurality of patterns at the same time.

3 Claims, 9 Drawing Sheets

FOREIGN PATENT DOCUMENTS

| | | |
|---|---|---|
| EP | 1 003 078 | 5/2000 |
| EP | 1 376 663 | 1/2004 |
| JP | 61-3339 | 1/1986 |
| JP | 2-44539 | 2/1990 |
| JP | 3-100942 | 4/1991 |
| JP | 2000-90487 | 3/2000 |
| WO | WO 03/096123 | 11/2003 |

OTHER PUBLICATIONS

Li, et al., "Direct three-dimensional patterning using nanoimprint lithography". *Applied Physics Letters*, vol. 78, No. 21, May 21, 2001, pp. 3322-3324.

European Search Report dated May 6, 2005, In EP 03 01 6539.

* cited by examiner

STAMPER, LITHOGRAPHIC METHOD OF USING THE STAMPER AND METHOD OF FORMING A STRUCTURE BY A LITHOGRAPHIC PATTERN This application is a Divisional application of application Ser. No. 10/628,275, filed Jul. 29, 2003, now U.S. Pat. No. 7,192,529 the contents of which are incorporated herein by reference in their entirety.

BACKGROUND OF THE INVENTION

1. Field of the Invention

The present invention relates to a stamper, a lithographic method using the stamper and a method of forming a structure by a lithographic pattern.

2. Description of the Related Art

In the conventional process for fabricating a semiconductor device, the photolithography has often been used as a technique for pattern transfer to form a finely detailed structure. With the miniaturization of the pattern, however, the pattern size is limited by the wavelength of the light used for exposure on the one hand and a mechanism is required for controlling the mask position with high accuracy on the other hand, thereby leading to the disadvantage of a high apparatus cost. A technique for forming a fine pattern at a low cost has been disclosed in U.S. Pat. No. 5,772,905. According to this technique, a stepped stamper having the same protrusions and recesses as the desired pattern to be formed on the substrate is pressed on a resist film layer formed on the surface of an object substrate thereby to transfer a predetermined pattern. This nano imprint technique described in U.S. Pat. No. 5,772,905 cited above is considered to make it possible to form a pattern as small as not more than 25 nanometers.

Even with the imprint technique considered to be capable of forming a fine pattern, however, a plurality of stamps of patterns are required to be prepared, as in photolithography, to form a structure configured of a plurality of patterns. Also, the positions of patterns are required to be matched with each other, thereby increasing the fabrication cost unavoidably.

SUMMARY OF THE INVENTION

In view of the technical problems described above, the object of the present invention is to provide a stamper for transferring a plurality of patterns collectively.

This object can be achieved by a stamper for transferring a plurality of patterns collectively, comprising a substrate and a plurality of protrusions having different heights formed on one of the surfaces of the substrate, wherein the protrusions of larger height have a stack structure including at least two layers of not less than two types of materials.

The protrusions of smaller height preferably have a stack structure with a smaller number of layers than the protrusions of larger height.

Also, the adjoining ones of the materials of the protrusions of larger height preferably have different etching rates for a predetermined etching technique.

Further, the areas of the materials of the protrusions having the same height from the substrate surface are preferably formed of the same type of material.

Other objects, features and advantages of the invention will become apparent from the following description of the embodiments of the invention taken in conjunction with the accompanying drawings.

DESCRIPTION OF THE EMBODIMENTS

Embodiment 1

An embodiment of the invention will be explained below. The explanation of this embodiment deals with the structure and a method of fabricating a stamper.

Figure 1:
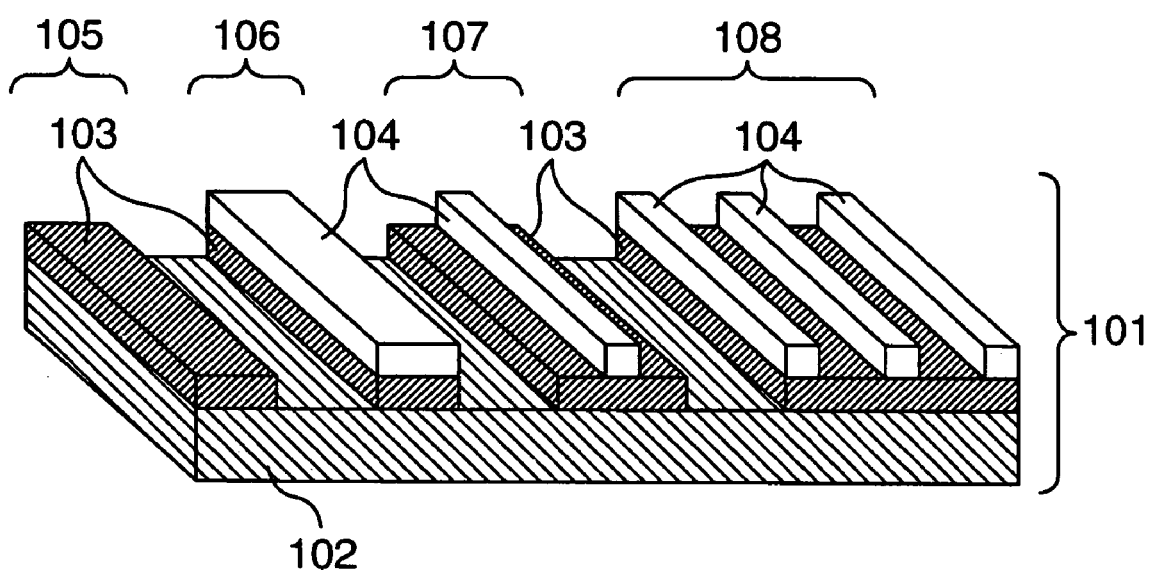
FIG. 1 is a perspective view of a stamper structure according to the invention.

FIG. 1 is a perspective view of a stamper according to the invention. A stamper 101 has a structure formed with protrusions 105, 106, 107, 108 of different shapes on one of the surfaces of a stamper substrate 102. The protrusions 105 and 106 both have a simple shape of different heights. The lower protrusion 105 is composed of a first material alone, while the portion of the taller protrusion 106 having the same height as the protrusion 105 is composed of the first material 103 while the portion of the taller protrusion 106 taller than the protrusion 105 is composed of a second material 104. The protrusions 107, 108 are both formed of portions having different heights combined. Like in the protrusion 106, the portion of each of the protrusions 107, 108 having the same height as the protrusion 105 is composed of the first material 103 while the portion thereof taller than the protrusion 105 is composed of the second material 104. One of the features of this embodiment lies in that the stamper comprises a substrate and a plurality of members (protrusion 106) of a stack structure having a plurality of steps formed on the substrate, each of the members being composed of at least two types of different materials. Also, the adjoining ones of the layers of each member are formed of materials having different etching rates against a predetermined etching method.

In the case where a silicon substrate is used as a stamper material, the photolithography and the etching technique generally used in the semiconductor fabrication process are applicable in producing an irregular shape.

Figure 2A:
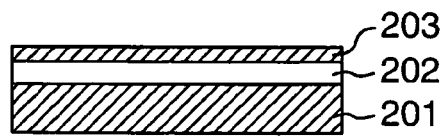
FIGS. 2A to 2H are diagrams for explaining a process of steps for fabricating a stamper according to the invention.

FIGS. 2A to 2H are diagrams for explaining the process of fabricating a stamper. First, as shown in FIG. 2A, a silicon oxide film 202 having a thickness of 1.5 micrometers is formed on one surface of a single-crystal silicon substrate 201 having a thickness of 500 micrometers. Further, a silicon film 203 having a thickness of 1.0 micrometer is formed over the entire surface of the silicon oxide film 202.

Figure 2B:
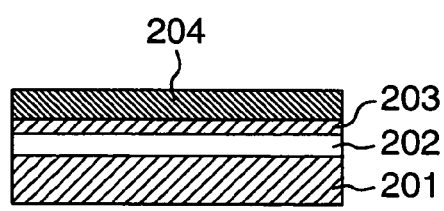

Next, as shown in FIG. 2B, the surface of the polycrystal silicon film 203 is coated with an ultraviolet-softened resist 204.

Figure 2C:
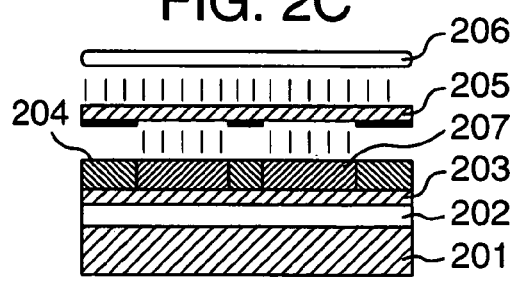

As the next step, as shown in FIG. 2C, the ultraviolet light is radiated on the resist 204 by an ultraviolet lamp 206 through a photomask 205 having a predetermined pattern, so that the resist is softened at the radiated positions thereby to form softened-resist portions 207.

Figure 2D:
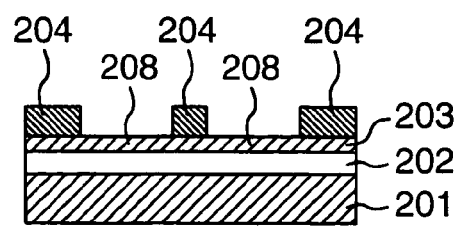

The resist 204 is developed and the softened resist portions 207 are removed. Thus, as shown in FIG. 2D, exposed areas 208 are formed on the surface of the silicon film 203. The width of each exposed area 208 is 3.0 micrometers.

Figure 2E:
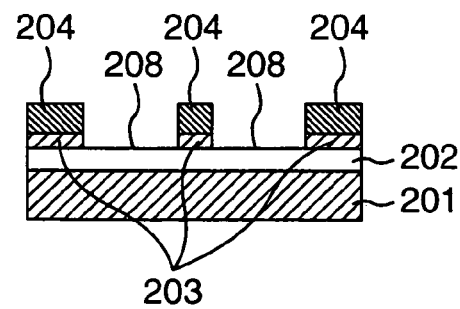

Next, the exposed areas 208 of the polycrystal silicon film 203 is dry-etched with $Cl_2$ (chlorine) gas. Only the polycrystal silicon film 203 is selectively etched, and the underlying silicon oxide film 202 is not substantially etched. As a result, a structure shown in FIG. 2E is produced.

Figure 2F:
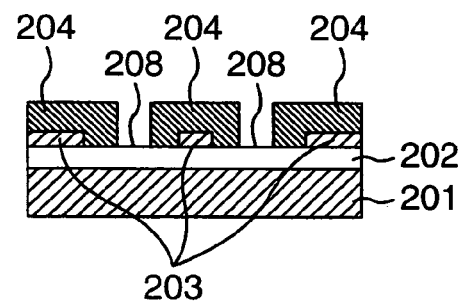

The remaining resist 204 is removed in its entirety, and another resist 204 is coated on the surface of the polycrystal silicon films 203 and the silicon oxide film 202 for exposure and development with a photomask (not shown) having a second pattern. In this way, a structure with the silicon oxide film 202 exposed in the exposed areas 208 is obtained as shown in FIG. 2F. The width of each exposed area 208 is 1.0 micrometer.

Figure 2G:
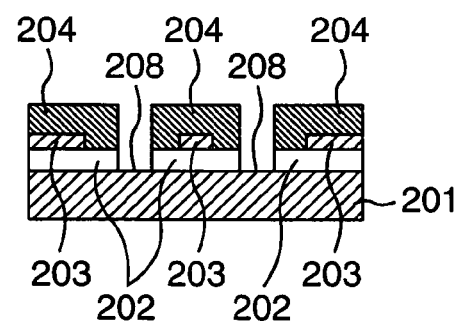

The exposed areas 208 are dry-etched with the $CHF_3/O_2$ gas. Only the silicon oxide film 202 is selectively etched, while the underlying single-crystal silicon substrate 201 is not substantially etched. Thus, a structure shown in FIG. 2G is obtained.

Figure 2H:
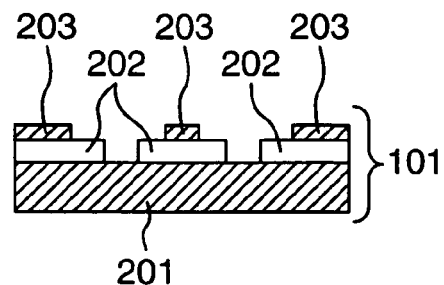

The remaining part of the resist 204 is removed entirely. A stamper 101 having a structure shown in FIG. 2H is produced.

This embodiment represents a case in which the $Cl_2$ gas is used as an etching gas for the polycrystal silicon film 203. Nevertheless, such a gas as $CF_4/O_2$, HBr or $Cl_2/HBr/O_2$ can alternatively be used with equal effect. These gases, like the $Cl_2$ gas, have a much lower etching rate against the silicon oxide film than against the polycrystal silicon film. Thus, the polycrystal silicon film alone can be selectively etched. Also, as an alternative to the $CHF_3/O_2$ gas described above as an etching gas for the silicon oxide film 202, any of such gases as $CF_4/H_2$, $CHF/O_2$, $C_2F_6$ and $C_3F_8$ can alternatively be used with equal effect. These gases, like the $CHF_3/O_2$ gas, have a much lower etching rate against the polycrystal silicon film than against the silicon oxide film, and therefore only the silicon oxide film can be selectively etched.

As in this embodiment, the use of an etching process capable of exhibiting selectivity between the adjoining materials of protrusions having a stack structure makes it possible to control the height of each step according to the thickness of each material. In other words, by regulating the thickness of each material uniformly, the dimensions can be controlled in stable fashion without regard to any variations of the etching conditions.

Embodiment 2

Another embodiment of the invention will be explained below. This embodiment refers to a structure of a stamper and a method of fabricating the stamper.

The stamper described in the first embodiment can of course be used for pattern transfer. After repeated transfer operations, however, a pattern transfer failure may be caused by the degeneration of the stamper. For this reason, the cost may sometimes be effectively reduced by using, as a new stamper, the structure obtained by duplicating a pattern of the first stamper making up the original plate.

Figure 3A:
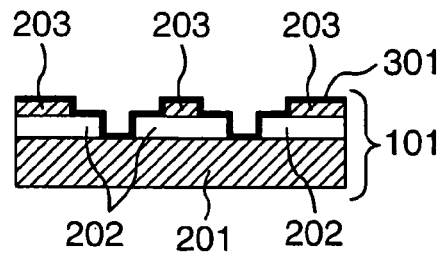
FIGS. 3A to 3D are diagrams for explaining another process of the steps for fabricating a stamper according to the invention.
Figure 3B:
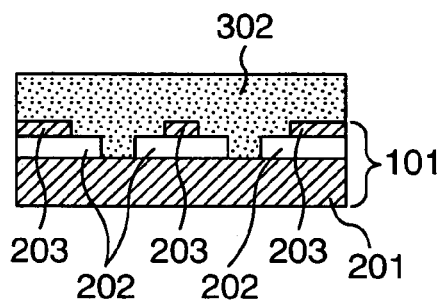
Figure 3C:
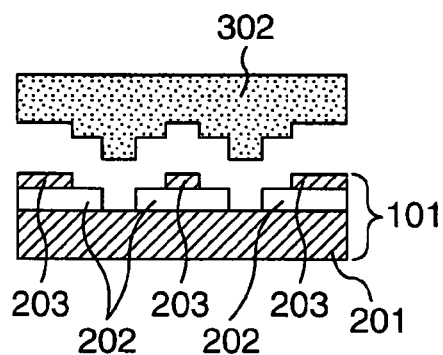
Figure 3D:
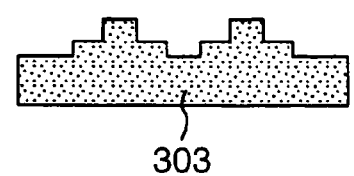

FIGS. 3A to 3D show a method of fabricating a stamper using, as an original plate, the stamper obtained according to the first embodiment. First, as shown in FIG. 3A, the entire surface of the stamper 101 having a stepped pattern is formed with a metal nickel film 301 by sputtering. Next, as shown in FIG. 3B, the surface of the metal nickel film 301 is electroplated thereby to form a nickel plated film 302. Next, as shown in FIG. 3C, the stamper plate 101 is separated from the nickel plated film 302. In this way, a stamper 303 having a nickel plated layer can be produced as shown in FIG. 3D. This method can reproduce the stamper 303 having protrusions of a stepped pattern reverse to that of the stamper 101 making up the original plate.

Figure 4A:
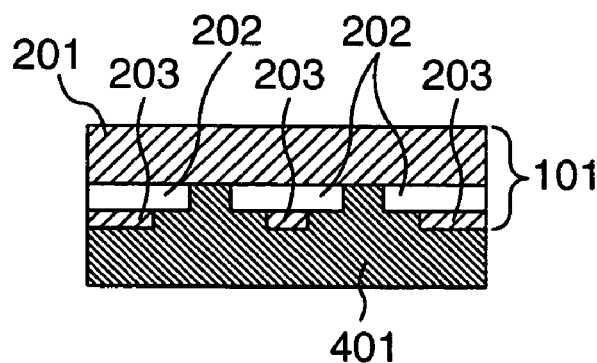
FIGS. 4A to 4F are diagrams for explaining still another process of the steps for fabricating a stamper according to the invention.
Figure 4D:
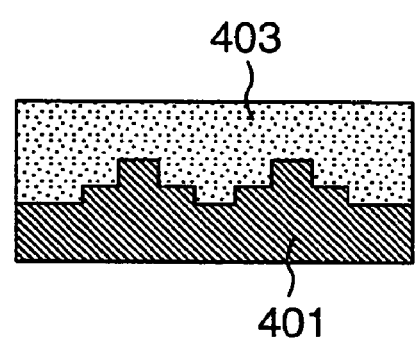
Figure 4B:
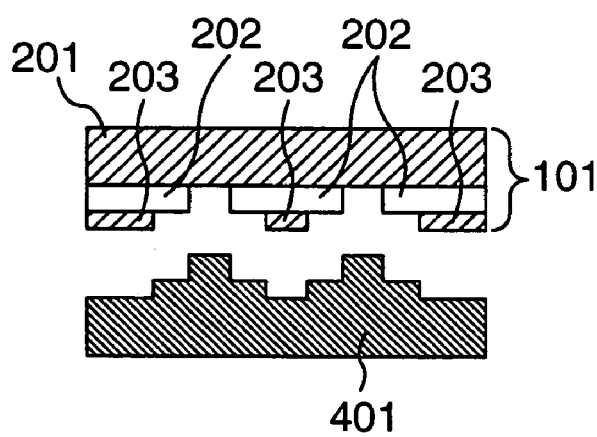
Figure 4E:
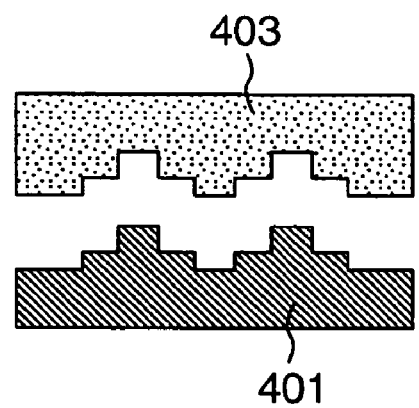
Figure 4C:
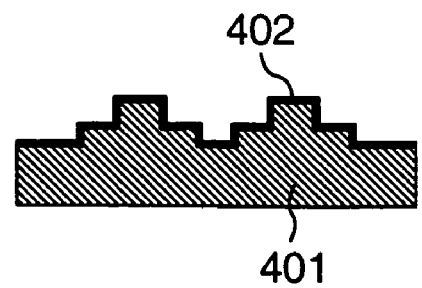
Figure 4F:
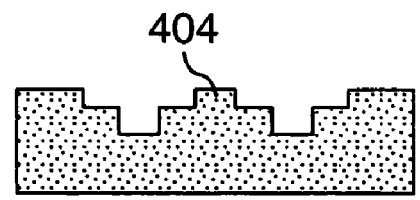

FIGS. 4A to 4F show another method of fabricating a stamper using, as an original plate, the stamper produced according to the first embodiment. First, the stamper 101 making up the original plate in contact with an epoxy resin substrate 401 is heated to about the glass transition temperature of the epoxy resin substrate 401 thereby to soften the substrate. In this way, the epoxy resin substrate 401 is deformed as shown in FIG. 4A. The whole assembly is then cooled to 25° C., after which the stamper 101 and the epoxy resin substrate 401 are separated from each other as shown in FIG. 4B. Next, the surface of the epoxy resin substrate 401 having a stepped pattern is formed with a nickel metal film 402 by sputtering thereby to produce the structure shown in FIG. 4C. As shown in FIG. 4D, the surface of the nickel metal film 402 is formed with a nickel plated film 403 by electroplating. As shown in FIG. 4E, the nickel plated film 403 and the epoxy resin substrate 401 are separated from each other thereby to produce a stamper 404 as shown in FIG. 4F. The stamper 404 fabricated by this method has protrusions of the stepped pattern of the stamper 101 reproduced as it is from the original plate.

Embodiment 3

Still another embodiment of the invention will be explained below. This embodiment concerns a method of pattern transfer.

Figure 5:
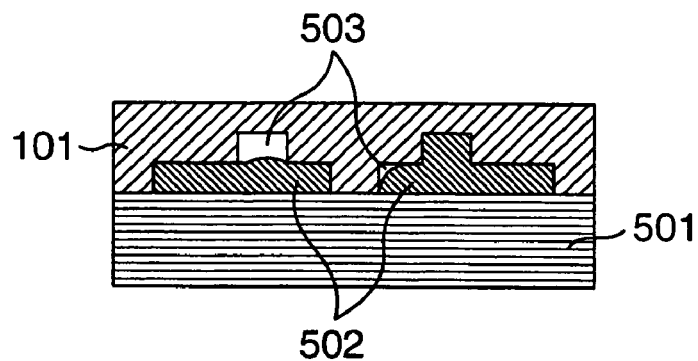
FIG. 5 is a diagram for explaining a defect occurring at the time of pattern transfer.

In the imprint technique, a pattern is transferred using a stamper through such steps that the substrate surface to which the pattern is to be transferred is formed with a resist film in advance, and the stamper is pressed against the resist film thereby to deform the resist. In this way, the stepped pattern formed on the surface of the stamper is transferred to the resist. In the case where the resist 502 formed on the surface of the object substrate 501 is not sufficiently deformed when the stamper 101 is pressed against the resist 502 as shown in FIG. 5, however, gaps 503 may be left with the stamper 101 resulting in a pattern defect.

Figure 6A:
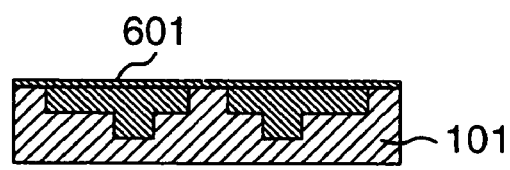
FIGS. 6A to 6C are diagrams for explaining a pattern transfer method according to the invention.
Figure 6B:
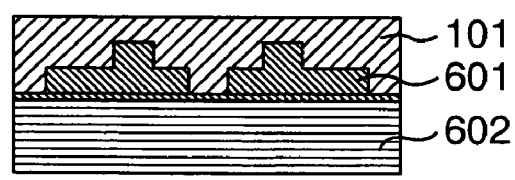
Figure 6C:
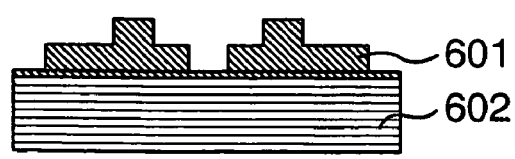

A pattern transfer method for obviating this problem will be explained with reference to FIGS. 6A to 6C. First, as shown in FIG. 6A, the surface of the stamper 101 having a stepped pattern is spin-coated with a resist 601 so that the resist 601 is filled in the recesses of the stamper 101. Next, as shown in FIG. 6B, the resist 601 is brought into contact with an object substrate 602, and then the resist 601 is hardened by heat treatment. The whole assembly is cooled to 25° C., after which the stamper 101 is separated. In this way, the resist 601 is transferred to the surface of the object substrate 602, thereby producing the structure shown in FIG. 6C. According to this method, the stepped pattern can be transferred in the same manner as if the stamper is kept in contact with the resist coated in advance on the surface of the substrate, while at the same time suppressing the occurrence of a pattern defect which otherwise might be caused by an insufficient resist deformation.

Embodiment 4

Yet another embodiment of the invention will be explained below. In this embodiment, the surface of an object substrate is processed using a transferred pattern.

Figure 7A:
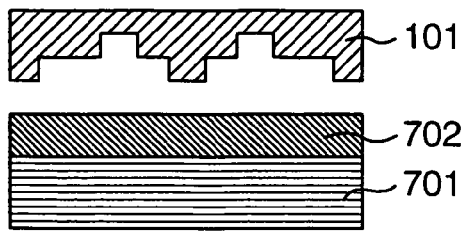
FIGS. 7A to 7E are diagrams for explaining a pattern transfer method according to the invention.
Figure 7B:
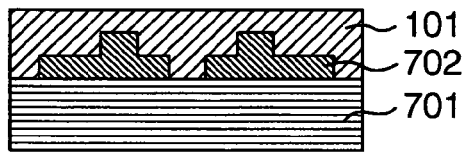
Figure 7C:
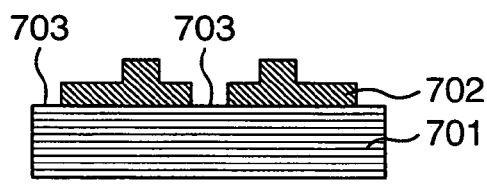
Figure 7D:
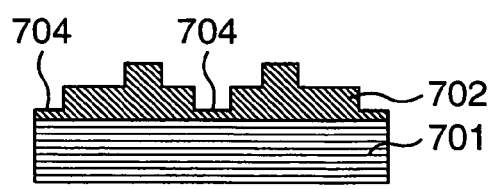
Figure 7E:
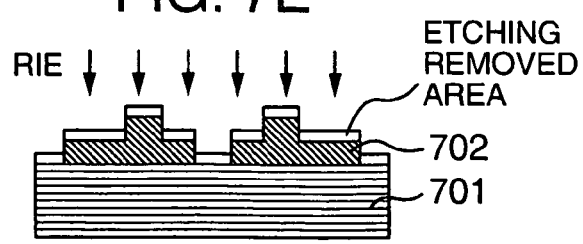

With reference to FIGS. 7A to 7E, the process of steps for transferring a pattern will be explained. As shown in FIG. 7A, a glass substrate 701 with a resist 702 coated thereon is prepared. As shown in FIG. 7B, a stamper 101 is brought into contact with the resist 702 while at the same time heating the whole assembly to the glass transition temperature of the resist 702. In this way, the stepped pattern of the stamper 101 is transferred by the deformation of the resist 702. Next, the whole assembly is cooled to 25° C., after which the stamper 101 is removed. As shown in FIG. 7C, a resist pattern is obtained with exposed areas 703 on the surface of the glass substrate 701. The glass substrate 701 is processed using the exposed areas 703. In the case where the thickness of the resist 702 is larger than the height of the protrusions of the stamper 101 in FIG. 7A, residual resist areas 704 are formed in the recesses of the resist 702 as shown in FIG. 7D. Therefore, the resist 702 is subjected to the reactive ion etching process (hereinafter referred to as RIE) having the anisotropic characteristic as shown in FIG. 7E, thereby making it possible to form a resist pattern having the same structure as in FIG. 7C.

Figure 8A:
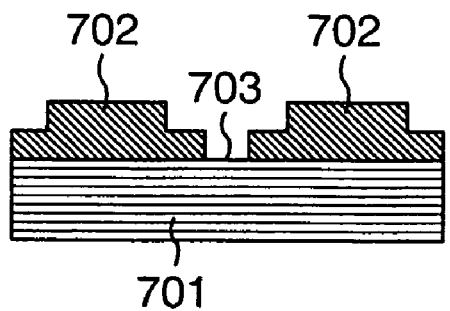
FIGS. 8A to 8E are diagrams for explaining the process of steps for forming a stepped channel or groove according to the invention.
Figure 8B:
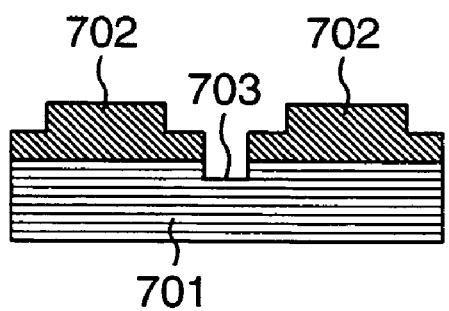
Figure 8C:
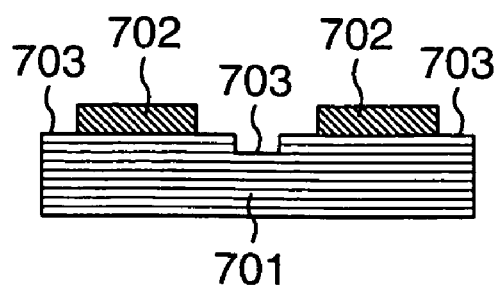
Figure 8D:
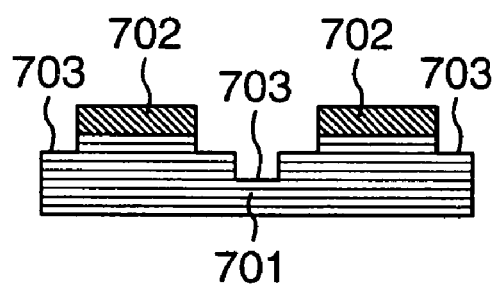
Figure 8E:
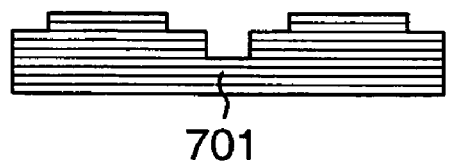

An explanation will be given of the steps of processing a groove having a complicated cross section in the surface of a glass substrate using the resist pattern obtained as described above. FIGS. 8A to 8E are diagrams for explaining the steps of forming a groove in the surface of the glass substrate. FIG. 8A shows a state immediately after forming a resist pattern having an exposed area 703 of the glass substrate 701 by the pattern transfer process described above. By dry-etching the surface of the glass substrate 701 corresponding to the exposed area 703 with $CF_4/H_2$ gas, only the part of the glass substrate 701 corresponding to the exposed area 703 is etched into the structure as shown in FIG. 8B. The subsequent resist etching by RIE until complete removal of the entire low-stepped portions of the resist 702 removes the resist and enlarges the exposed areas 703 as shown in FIG. 8C. Under this condition, the dry etching is carried out with $CF_4/H_2$ gas again. Only the exposed areas 703 are etched to form the structure shown in FIG. 8D. After that, the resist 702 is removed to produce a channel-shaped glass substrate as shown in FIG. 8E. In place of the $CF_4/H_2$ gas used in this embodiment, such gases as $SF_6$, $CF_4$, $CHF_3$, $CF_4/O_2$, HBr, $Cl_2$ and $Cl/HBr/O_2$ may be used with equal effect.

According to this embodiment, a plurality of resist patterns for forming a groove having a complicated shape of the cross section can be formed in a single pattern transfer process. Therefore, as compared with the conventional photolithography or imprint technique, the number of parts and the number of steps required can be reduced for a lower fabrication cost. Also, since the position matching between the patterns is eliminated, a shape having a high dimensional accuracy can be obtained easily.

Embodiment 5

A further embodiment of the invention will be explained below. This embodiment represents the steps for fabricating an optical waveguide using a pattern transferred.

Figure 9A:
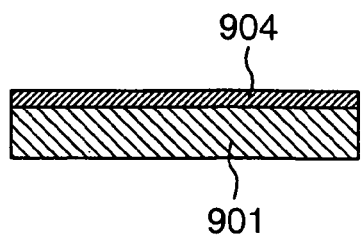
FIGS. 9A to 9H are diagrams for explaining the process of steps for forming a structure according to the invention.
Figure 9B:
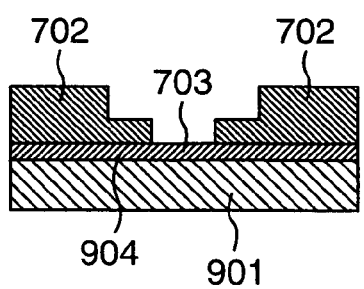
Figure 9C:
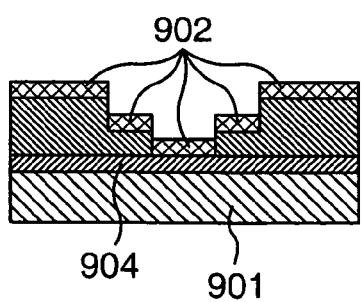
Figure 9D:
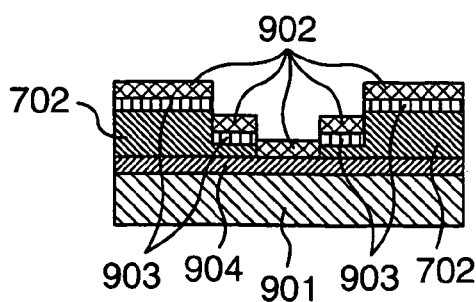
Figure 9E:
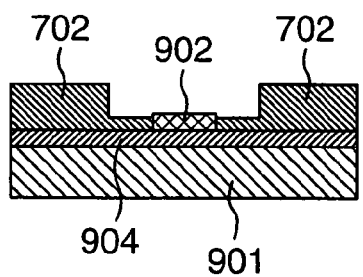
Figure 9F:
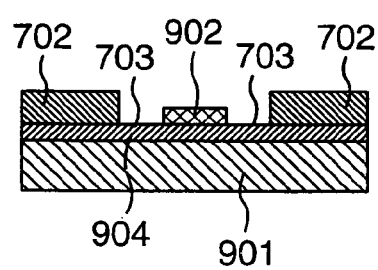
Figure 9G:
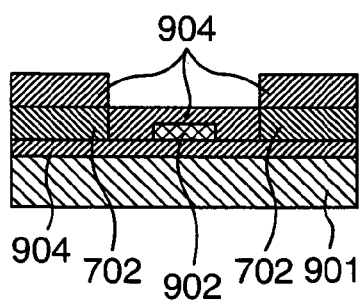
Figure 9H:
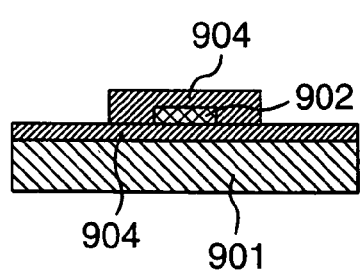

First, as shown in FIG. 9A, a clad member 904 is formed on the surface of a glass epoxy substrate 901, and held at 150° C. for two hours thereby to thermally setting the clad member 904. The clad member 904 is made of a mixture of cycloaliphatic epoxy resin, methyl nadic anhydride and an imidazole-based catalyst. After coating an ultraviolet-softened resist 702 on the surface of the clad member 904, the pattern is transferred using the stamper according to the invention. In this way, a structure as shown in FIG. 9B is obtained. Next, as shown in FIG. 9C, core members 902 are formed on the surface of the resist 702 and the exposed area 703, after which the core members 902 are thermally set by being held at 150° C. for two hours. The core members 902 are made of a mixture of liquefied bisphenol A-type epoxy resin, phenolic novolac resin and triphenyl phosphine as a material. The entire surface formed with the core members 902 is irradiated with the ultraviolet light by an ultraviolet lamp (not shown). Then, the ultraviolet light is radiated also on the resist 702 through the core members 902. In the process, as shown in FIG. 9D, the parts of the resist 702 located in contact with the core members 902 are exposed thereby to form softened resist portions 903. The resist 702 is developed to remove the softened resist portions 903. At the same time, the core members 902 that have been formed on the surface of the softened resist portions 903 are removed thereby to produce the structure shown in FIG. 9E. Until the low-stepped portions of resist 702 are entirely removed, the resist etching is carried out by RIE. As shown in FIG. 9F, the portions of the resist 702 adjoining the core member 902 are removed thereby to form new exposed areas 703. As shown in FIG. 9G, clad members 904 are formed on the surface of the resist 702, the exposed areas 703 and the core member 902, after which the clad members 904 are thermally set by being held at 150° C. for two hours. Under this condition, the resist 702 is removed by the lift-off method or by development after radiating the ultraviolet light until the whole resist 702 is softened. In this way, as shown in FIG. 9H, an optical waveguide having such a structure that the core is surrounded by the clad member is obtained. Unlike in this embodiment using an epoxy material for the optical waveguide, such a material as polyimide, acryl or silicon may of course be used with equal effect.

Embodiment 6

A still further embodiment of the invention will be explained below. This embodiment represents the process of steps for fabricating a multilayer wiring substrate using the pattern transferred.

Figure 10A:
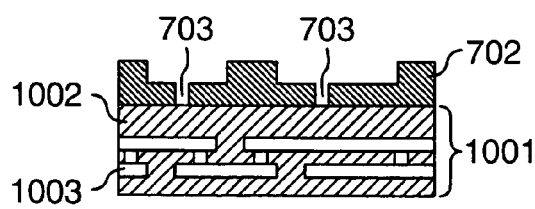
FIGS. 10A to 10L are diagrams for explaining the process of steps for forming a multilayer wiring according to the invention.
Figure 10G:
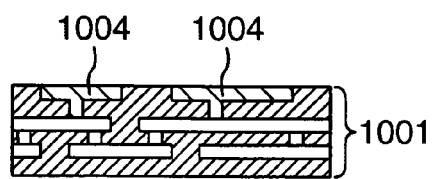
Figure 10B:
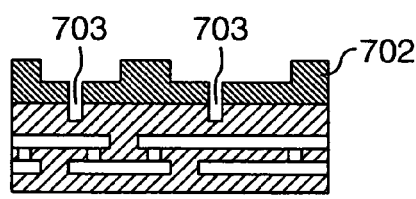
Figure 10H:
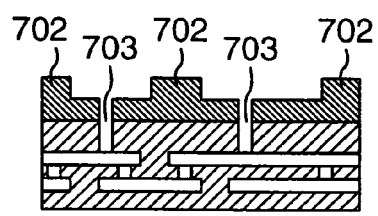
Figure 10C:
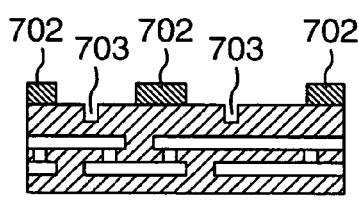
Figure 10I:
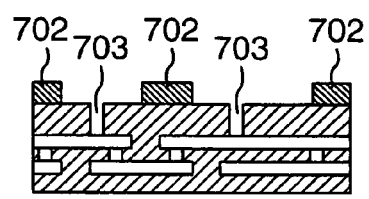
Figure 10D:
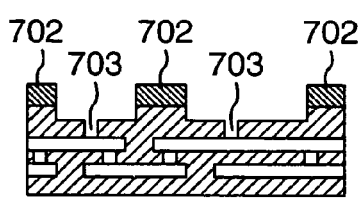
Figure 10J:
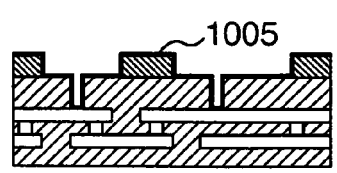
Figure 10E:
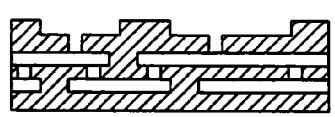
Figure 10K:
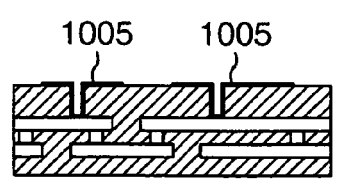
Figure 10F:
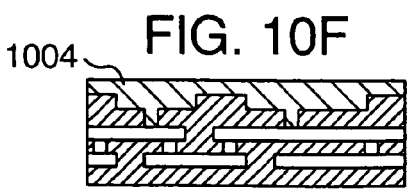
Figure 10L:
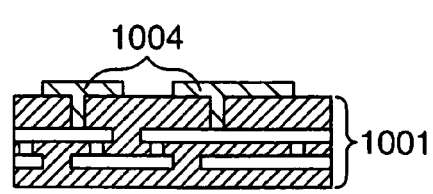

FIGS. 10A to 10L are diagrams for explaining the steps of fabricating a multilayer wiring substrate. First, as shown in FIG. 10A, a resist 702 is formed on the surface of a multilayer wiring substrate 1001 configured of a silicon oxide film 1002 and a copper wire 1003, after which a pattern is transferred by a stamper (not shown). The exposed areas 703 of the multilayer wiring substrate 1001 are dry-etched with $CF_4/H_2$ gas. As shown in FIG. 10B, each exposed area 703 is processed into the shape of a channel in the surface of the multilayer wiring substrate 1001. The resist 702 is etched by RIE to remove the low-stepped portions of the resist 702. As shown in FIG. 10C, the exposed areas 703 are enlarged. Under this condition, the exposed areas 703 are dry-etchd until the channels already formed reach the depth of the copper wire 1003. Thus, the structure shown in FIG. 10D is obtained. By removing the resist 702, the multilayer substrate 1001 having channel-shaped grooves in the surface thereof is obtained as shown in FIG. 10E. After forming a metal film by sputtering on the surface of the multilayer wiring substrate 1001 (not shown), a metal plated film 1004 is formed by electrolytic plating, as shown in FIG. 10F. After that, the metal plated film 1004 is polished until the silicon oxide film 1002 of the multilayer wiring substrate 1001 is exposed. As shown in FIG. 10G, the multilayer wiring substrate 1001 having a metal wiring in the surface thereof is obtained.

Another process of steps for fabricating a multilayer wiring substrate will be explained. The exposed areas 703 are dry-etched from the state shown in FIG. 10A until the copper wire 1003 in the multilayer wiring substrate 1001 is reached. The structure shown in FIG. 10H is produced. The resist 702 is etched by RIE to remove the low-stepped portions thereof to produce the structure shown in FIG. 10I. From this state, metal films 1005 are formed by sputtering on the surface of the multilayer wiring substrate 1001 thereby to produce the structure shown in FIG. 10J. The resist 702 is removed by liftoff thereby to produce the structure shown in FIG. 10K. Then, the remaining portions of the metal films 1005 are electrolytically plated thereby to obtain the multilayer wiring substrate 1001 having the structure shown in FIG. 10L.

As explained above with reference to the embodiments, the use of a stamper having at least two steps on the side wall surface of each protrusion of the stamper surface makes it possible to collectively transfer a pattern for forming a channel structure having a complicated shape of the cross section and a structure made of a plurality of materials. As compared with the conventional lithography and imprint technique, therefore, the fabrication cost can be reduced.

It will thus be understood from the foregoing description that according to this invention, a plurality of patterns can be collectively transferred so that the self-alignment can be achieved between the patterns, thereby making it possible to form a structure, a groove or a wiring having a high dimensional accuracy.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A method of forming a structure using a pattern transferred by a stamper, comprising:

the step of forming a resist pattern having n physical steps (n: an integer greater than one) on the surface of an object substrate by a stamper having a plurality of physical steps; and selected one of the step of etching the surface of at least a recessed area of said resist pattern where said object substrate is exposed, and the step of forming a first structural material on the surface of said recessed area of said resist pattern where said object substrate is exposed;

the step of forming at least a new area of said resist pattern where said object substrate is exposed, by removing the resist of said resist pattern to the height of the first physical step from the surface of said object substrate;

selected one of the step of etching the surface of at least a recessed area of said resist pattern where said object substrate is exposed, and the step of forming at least a new structural material on the surface of the recessed area of said resist pattern including the surface of the structural material formed the immediately preceding time; and forming at least a new area where the object substrate is exposed, by removing the resist to the height of the second physical step from the surface of said object substrate of said resist pattern;

said step of forming at least a new area being repeated up to n times.

2. A method of forming a structure according to claim 1, wherein a step in case of using a translucent material as a structural material of the mth physical step ($m \leq n$) includes the steps of:

forming said translucent material on the surface of said resist pattern and said area where said object substrate is exposed;

softening the surface of said resist in contact with said translucent material by radiating the light over the entire surface of said translucent material;

removing said softened area and said translucent material in contact with said softened area by developing said resist; and forming at least a new area where said object substrate is exposed, by removing the resist to the height of the mth physical step of said resist pattern from said the surface of said object substrate.

3. A method of forming a structure according to claim 1, wherein said selected one of the step of etching the surface of at least a recessed area of said resist pattern where said object substrate is exposed, and the step of forming a first structural material on the surface of said recessed area of said resist pattern where said object substrate is exposed is the step of forming the first structural material on the surface of the recessed area of said resist pattern where said object substrate is exposed.

* * * * *